(12) United States Patent
Wang et al.

(10) Patent No.: US 12,727,115 B2
(45) Date of Patent: Sep. 1, 2026

(54) LIQUID COOLING HEAT DISSIPATION SYSTEM

(71) Applicant: TOP RANK TECHNOLOGY LIMITED, Apia (WS)

(72) Inventors: Tien-Lai Wang, Apia (WS); Tzu-Yu Wang, Apia (WS); Cheng-Yu Wang, Apia (WS); Meng-Yu Lee, Apia (WS)

(73) Assignee: TOP RANK TECHNOLOGY LIMITED, Apia (WS)

(*) Notice: Subject to any disclaimer, the term of this patent is extended or adjusted under 35 U.S.C. 154(b) by 239 days.

(21) Appl. No.: 18/814,623

(22) Filed: Aug. 26, 2024

(65) Prior Publication Data

US 2025/0324539 A1 Oct. 16, 2025

(30) Foreign Application Priority Data

Apr. 12, 2024 (TW) ................................ 113113852

(51) Int. Cl.
*H05K 7/20* (2006.01)

(52) U.S. Cl.
CPC ..... *H05K 7/20254* (2013.01); *H05K 7/20136* (2013.01); *H05K 7/20272* (2013.01)

(58) Field of Classification Search
CPC ........... H05K 7/20254; H05K 7/20136; H05K 7/20272; H05K 7/20263; H05K 7/20336; H05K 7/20809; H05K 7/2029; H05K 7/20218; F28D 15/0233; F28D 15/046; H10W 40/73; G06F 1/20
See application file for complete search history.

(56) References Cited

U.S. PATENT DOCUMENTS

| | | | | |
|---|---|---|---|---|
| 6,889,756 B1 * | 5/2005 | Hou | F28D 15/0233 174/15.2 |
| 2011/0079376 A1 * | 4/2011 | Loong | B01D 8/00 165/185 |
| 2018/0151473 A1 * | 5/2018 | Liang | F28F 21/065 |
| 2019/0004573 A1 * | 1/2019 | Kulkarni | G06F 1/20 |

* cited by examiner

*Primary Examiner* — Jacob R Crum
(74) *Attorney, Agent, or Firm* — WPAT, PC

(57) ABSTRACT

A liquid-cooling heat dissipation system includes: a liquid-cooling vapor chamber, a liquid-cooling heat dissipation plate, a first and a second coolant pipelines connecting the two, a coolant circulation machine, a fan, and a cooling liquid. The liquid-cooling vapor chamber includes a liquid-cooling cover, a metallic top cover, and a metallic bottom cover. The liquid-cooling heat dissipation plate includes a heat dissipation bottom plate and a heat dissipation outer cover. The coolant circulation machine pumps the cooling liquid from the first coolant pipeline into the liquid cooling cover, and then flows into the liquid-cooling heat dissipation plate. The fan locked on the bottom plate outer surface blows air to the liquid-cooling heat dissipation plate, so that the cooling liquid is cooled when flowing through the second accommodation space in the liquid cooling heat dissipation plate, and then flows back to the coolant circulations machine for recirculation.

14 Claims, 14 Drawing Sheets

LIQUID COOLING HEAT DISSIPATION SYSTEM

CROSS REFERENCE TO RELATED APPLICATION

This application claims the benefits of Taiwan application Serial No. 113113852, filed on Apr. 12, 2024, the disclosures of which are incorporated by references herein in its entirety.

TECHNICAL FIELD

The present disclosure relates in general to a heat dissipation system, and more particularly to a liquid-cooling heat dissipation system.

BACKGROUND

The explosive development of generative artificial intelligence (Generative AI) or artificial intelligence generated content (AI Generated Content; AIGC) has greatly increased the development needs for high-speed computing power and high-end computing chip modules. The huge data volume and processing speed required by AIGC applications continue to drive the demand for high-end AI servers. High-end AI servers use a larger number of central processing units (CPUs) and graphics processing units (GPUs) at the same time. In order to cope with the high-speed and large-scale computing requirements of generative artificial intelligence (such as ChatGPT), the number of transistors contained in the chip the high-end AI servers used has reached 175 billion. Corresponding to the high efficiency and high power consumption of AI server chips, the accompanying great amount and high-density heat sources have become a major challenge to heat dissipation capabilities. For example, in 2018, the power consumption of the server processor is only about 180 W~280 W, but it increases to more than 500 W in 2023. For example, the 5 nm process Genoa processor launched by AMD's and the A100 chip launched by GPU manufacturer NVIDIA in 2022 already consume up to 400 W, which is about 40%~50% higher than the previous generation processor. In 2023, Bergamo processors consume more than 500 W. NVIDIA's new generation high-end GPU H100 chip, specially designed for AI servers, has a maximum power of up to 700 W. As the number of chips used in servers increases, the power consumption increases, and the module design complexity of the cooling solution also increases.

With the upgrade of new generation GPUs and CPUs, server computing, AI image generation and e-sports applications will become the main growth drivers of the cooling industry. From the perspective of server cooling technology, it is mainly divided into air cooling, liquid cooling and immersion cooling. Generally, when the power consumption of the chip exceeds 300 W, it is difficult to solve the heat dissipation problem through air cooling.

Immersion cooling can be divided into single-phase and two-phase immersion cooling. Immersion cooling has the highest heat dissipation efficiency and can even reach greater than 1500 W. The immersion cooling works by immersing the entire server in a tank with a large amount of coolant, thus, it is necessary to redesign and reconstruct the infrastructure of the computer room to suit its application. The coolant used for immersion cooling is not only extremely expensive, but also has environmental concerns in its application. In addition, more practical application data is needed to further clarify whether chips, PCB boards, network interface cards, power supplies and other electrical components can maintain their normal operation when immersed in coolant.

Due to the expanding computing power of ChatGPT or high-end AI servers, the heat dissipation capacity required must be at least higher than 700 W to be able to cope with it. For example, NVIDIA A100 or H100 AI servers are usually equipped with 4 to 8 GPUs, and each GPU will generate an additional 300 W to 700 W of heat energy. It is estimated that the thermal power consumption of the entire AI server will exceed 3000 W. In view of the fact that traditional air cooling cannot provide such efficient heat dissipation capabilities, the introduction of liquid cooling technology has become a new trend in heat dissipation solution. The liquid-cooling heat dissipation system introduces the cooling liquid into the server, taking advantage of the fact that the liquid conducts heat more efficiently than air, so that the high-density heat generated by the electronic components can be quickly transferred to the cooling liquid. Then the heat-absorbed cooling liquid is directed to the cooling tower or heat dissipation module to further dissipate the thermal energy into the atmosphere, achieving rapid cooling and reducing energy consumption. A common open-type liquid-cooling module currently seen in the industry is to combine the liquid-cooling and air-cooling heat dissipation components in server cabinets, which can provide a highly effective cooling efficiency. The open-type liquid-cooling module includes: liquid-cooling plate module (the cold plate), coolant distribution unit (CDU), and coolant distribution manifolds (manifolds, CDM), and it reduces the coolant temperature through the radiator(s) and fans on the cabinet, or a heat exchanger. When the open-type liquid-cooling module is operating, the coolant is pumped out by the coolant distribution unit and flows into the liquid-cooling plate which is closely in contact with the chip or processor through the coolant distribution manifold. The heat generated by the chip or processor is then conducted through the liquid-cooling plate and absorbed by the coolant in the liquid-cooling plate. The coolant absorbing the heat (hot coolant) is then flows out from the hot manifold at the other end of the liquid-cooling plate. The coolant after absorbing heat is then transported to and flows through the radiator(s) on the back-door of the cabinet, and is cooled down by the forced air-blow of the fan(s) on the back-door of the cabinet. After cooling down, the coolant flows back to the coolant distribution unit and is pumped into the liquid-cooling plate again.

The miniaturization and high integration of AI computing chips can be expected to lead to a significant increase in chip heat density. It is an important technical trend that the development of heat dissipation solutions should be getting closer to the core of the heat sources such as chips. The equipment modules of liquid-cooling, according to the application scale, can be divided into computer room level for large data center, server cabinet level, and chip level for AI computers in the future. Among them, the designed the liquid-cooling equipment module required for AI computers is relatively smaller in scale, its heat dissipation efficiency must be high enough to remove the high density heat generated by the small chips timely without using external air conditioner or chiller, so that the total power usage efficiency (PUE) of the heat dissipation system can be lower.

The liquid-cooling plate module commonly seen in liquid-cooling modules uses a liquid-cooling cover to cover the heat dissipation structure of the radiator, and the liquid-cooling cover and the radiator are locked together to form a cavity. The liquid-cooling cover includes a liquid inlet and a liquid outlet. The cooling liquid (or coolant) enters into the chamber formed by the liquid-cooling cover and the radiator from the liquid inlet. After flowing through the heat dissipation structure, the cooling liquid flows out of the chamber from the liquid outlet, and then flows to an external heat dissipation system (for example, the fin type heat sink accompany with fans) through a pipeline and dissipates the heat carried by the cooling liquid. However, since the lateral heat conduction speed is limited by the cross-sectional area of the metallic bottom plate of the radiator in the liquid-cooling plate module, when the metallic bottom plate contacts with the heat source element, the large amount of heat quickly generated by the heating element cannot be efficiently conducted laterally to the entire bottom area of the radiator. Consequently, the large amount of heat accumulates in the local area of the metallic bottom plate where the radiator contacts with. Even with the help of additional liquid-cooling heat dissipation module, the improvement of the heat dissipation efficiency is limited. In addition, the external cooling system uses pipes and fin-type heat sinks to exchange heat between each other, and coupled with air cooling by fans to dissipate heat. The area for direct heat dissipation of the cooling liquid is limited, and the heat dissipation efficiency is also insufficient.

In view of the above problems, the inventor of the present disclosure has designed a liquid-cooling heat dissipation system which includes a liquid-cooling vapor chamber to replace the metallic bottom plate of the above-mentioned liquid-cooling heat dissipation module. In addition, the heat dissipation structure of the radiator is also integrated on the heat dissipation surface of the vapor chamber by one-piece molding. Then, a liquid-cooling cover is used to cover the heat dissipation structure within its accommodation space to form a liquid-cooling vapor chamber characterized by having a vapor chamber in the bottom. The liquid-cooling cover includes a first liquid inlet and a first liquid outlet, this allows the cooling liquid to flow into the liquid-cooling cover and flow through the heat dissipation structure to enhance the heat exchange efficiency. Vapor chamber is characterized by its high heat conductivity, excellent in lateral uniformity of heat distribution, high heat diffusion coefficient, that are all significantly better than that of general metallic plate (such as copper plate, aluminum alloy plate). When the heat-generating element attached to the heat-absorption surface of the vapor chamber generates a large amount of heat, the heat is directly and quickly conducted to the vapor chamber. Meanwhile, the working fluid existing in the internal space of the vapor chamber quickly absorbs the heat and vaporizes immediately into steam. Since the heat dissipation structure of the radiator is disposed on the heat dissipation surface of the vapor chamber, thus, when the steam rapidly rises and touches the cold metallic surface containing the dissipation structure on the opposite side, it immediately condenses into working fluid again. By this rapid liquid-vapor-liquid phase transformation cycle, a large amount of heat is absorbed and then release in a fast and effective way. Compared with the traditional metallic plate, vapor chambers can laterally spread the high density heat more quickly to a larger area of the heat dissipation surface and thus having a larger effective heat dissipation area and faster heat dissipation.

The vapor chamber utilizes the phase transformation of the working fluid in its closed working chamber to rapidly dissipate heat. It is the heat dissipation method with the highest thermal conductivity at this stage. It utilizes the large amount of vaporization latent heat involved in the rapid vaporization and condensation process of the working liquid in the near-vacuum chamber to achieve rapid heat dissipation. The thermal conductivity efficiency of the vapor chamber can reach more than 10,000 W/(m2·° C.), which is dozens of times higher than which of the air convection or liquid convection. When the above-mentioned heat sink is integrated onto the heat dissipation surface of the vapor chamber in an integrated manner, a large amount of heat from inside the vapor chamber can be quickly and effectively conducted and dispersed to the heat dissipation structure of the heat sink, greatly improving the heat dissipation efficiency.

In addition, the liquid-cooling heat dissipation system of the present disclosure further includes a liquid-cooling heat dissipation plate, which is a plate-shaped structure with a hollow chamber. The hollow chamber includes a plurality of heat dissipation pillars protruding thereon the inner surface of the hollow chamber. The liquid-cooling heat dissipation plate includes at least one second liquid inlet and at least one second liquid outlet at the sidewall of the liquid-cooling heat dissipation plate. The second liquid inlet and the second liquid outlet are respectively connected to the first liquid outlet and the first liquid inlet of the liquid-cooling cover of the liquid-cooling vapor chamber through the cooling liquid pipelines, allowing the cooling liquid to circulate repeatedly between the liquid-cooling cover of the liquid-cooling vapor chamber and the liquid-cooling heat dissipation plate. After the cooling liquid in the liquid-cooling cover of the liquid-cooling heat dissipation vapor chamber absorbs the heat, it is then transported into the hollow chamber of the liquid-cooling heat dissipation plate and flows through and between the heat dissipation pillars in the hollow chamber. The plurality of heat dissipation pillars can provide larger surface area for heat exchange. In addition, the fans installed on the outside surface of the liquid-cooing heat dissipation plate can forcibly blow air to the outside surface of the liquid-cooling heat dissipation plate. Thus, the cooling liquid, after absorbing the heat, can flow and disperse to the liquid-cooling heat dissipation plate and dissipate the heat rapidly.

SUMMARY

The present disclosure provides a liquid-cooling heat dissipation system, which includes at least one liquid-cooling vapor chamber, one liquid-cooling heat dissipation plate, at least one first coolant pipeline and at least one second coolant pipeline connecting between the liquid-cooling vapor chamber and the liquid-cooling heat dissipation plate, a coolant circulation machine, at least one fan, and a cooling liquid.

To explain, the liquid-cooling vapor chamber disclosed in the present disclosure, as mentioned above, is a high-efficiency liquid-cooling vapor chamber composed of a liquid-cooling cover and an integrated vapor chamber. The liquid-cooling cover includes a top and a sidewall connecting to the top. The sidewall surrounds the top to form a first accommodating space. The sidewall is provided with at least one first liquid inlet and at least one first liquid outlet. The first liquid inlet and the first liquid outlet are connected in the first accommodating space. The integrated vapor chamber includes a metallic top cover, a metallic bottom cover, a working space, a vacuum channel, a plurality of capillary structures and a working fluid. The metallic top cover includes oppositely an outer heat-dissipating surface and an inner condensation surface. The outer heat-dissipating surface has a plurality of first heat dissipation pillars protruding therefrom. The inner condensation surface is surrounded by a top frame with a predetermined height, and the top frame is furnished with an upper communicative groove. The inner condensation surface has thereon a plurality of top grooves parallel to each other. The entire structure of the metallic top cover including the first heat dissipation pillars is made as a unique piece from the same metal body.

The metallic bottom cover includes oppositely an outer heat-absorption surface and an inner evaporation surface. The outer heat-absorption surface is used to contact a heat-generating element. The inner evaporation surface is surrounded by a bottom frame with another predetermined height, and the bottom frame is furnished with a lower communicative groove. The inner evaporation surface has thereon a plurality of bottom grooves parallel to each other, a plurality of columnar supporting structures protruding therefrom and disposing between the bottom grooves. The entire structure of the metallic bottom cover including the plurality of columnar supporting structures is made as a unique piece from the same metal body. The working space is formed by engaging the top frame of the metallic top cover and the bottom frame of the metallic bottom cover. The plurality of columnar supporting structures are protruding from the inner evaporation surface to contact individually at the inner condensation surface among the plurality of top grooves and providing support to the working space. The vacuum channel is formed by connecting spatially the upper communicative groove and the lower communicative groove so as provide a channel for vacuuming the working space. After vacuuming, the vacuum channel can then be sealed to keep the working space maintaining in a near vacuum state. The plurality of capillary structures are disposed individually inside the plurality of bottom grooves or both the top grooves and the bottom grooves. The working fluid is in the working space and the plurality of capillary structures. The liquid-cooling cover is engaged with the outer heat-dissipating surface of the metallic top cover with the first heat dissipation pillars accommodating within the first accommodating space to form the liquid-cooling vapor chamber of the present disclosure.

According to one embodiment of the present disclosure, the liquid-cooling heat dissipation plate includes: a heat dissipation bottom plate and a heat dissipation outer cover. The heat dissipation bottom plate has a bottom plate inner surface and oppositely a bottom plate outer surface. The bottom plate inner surface has thereon a plurality of second heat dissipation pillars protruding therefrom arranging in roughly a matrix manner. The bottom plate inner surface has thereon at least one flow guide slot protruding therefrom with a long-groove shape disposing between the plurality of second heat dissipation pillars for inserting at least one flow guide having a long-sheet shape. An outer cover insertion slot is protrudingly provided along the edge of the bottom plate inner surface. A plurality of fan screw holes are protrudingly provided on the bottom plate outer surface for mounting at least one fan to provide forced air-blow to the bottom plate outer surface for cooling. Wherein the entire structure of the heat dissipation bottom plate including the plurality of second heat dissipation pillars, the flow guide slot, the outer cover insertion slot, and the fan screw holes is made as a unique piece from the same metal body (metal sheet or metal block) by one-piece molding.

The heat dissipation outer cover has an outer cover top and an outer cover sidewall connected to the outer cover top. The outer cover sidewall surrounds the outer cover top to form a second accommodation space. The outer cover sidewall is provided with at least one second liquid inlet and at least one second liquid outlet. The second liquid inlet and the second liquid outlet are connected to the second accommodation space. Wherein, when the heat dissipation outer cover and the heat dissipation bottom plate are engaged to each other, the outer cover sidewall of the heat dissipation outer cover is inserted into the outer cover insertion slot of the heat dissipation bottom plate and then welded, and the plurality of second heat dissipation pillars are disposed in the second accommodation space, to form the liquid-cooling heat dissipation plate of the present disclosure. In one embodiment of the present disclosure, wherein the first coolant pipeline has one end connected to the first liquid inlet of the liquid-cooling vapor chamber and the other end connected to the second liquid outlet of the liquid-cooling heat dissipation plate, and the second coolant pipeline has one end connected to the first liquid outlet of the liquid-cooling vapor chamber and the other end connected to the second liquid inlet of the liquid-cooling heat dissipation plate. In one embodiment of the present disclosure, wherein the coolant circulation machine is disposed in between the first coolant pipeline or the second coolant pipeline for pumping and transmission the coolant (cooling liquid), in order to make the coolant to circulate between the liquid-cooling vapor chamber and the liquid-cooling heat dissipation plate to form the liquid-cooling heat dissipation system.

In one embodiment of the present disclosure, the outer heat-absorption surface of the metallic bottom cover is a flat surface for contacting the heat-generating electronic element (s).

In one embodiment of the present disclosure, the outer heat-absorption surface of the metallic bottom cover of the liquid-cooling vapor chamber further has at least one recessed space for accommodating at least one heat-generating electronic element, wherein the recessed space is a concave structure on the outer heat-absorption surface, without a corresponding convex structure on the inner evaporation surface.

In one embodiment of the present disclosure, wherein the outer heat-absorption surface has thereon a plurality of the recessed spaces for accommodating individually a plurality of heat-generating elements.

In one embodiment of the present disclosure, wherein the outer heat-absorption surface has thereon a plurality of the recessed spaces having the same or different shapes or volumes for accommodating individually a plurality of the heat-generating elements having the same or different shapes or volumes.

In one embodiment of the present disclosure, wherein the outer heat-absorption surface of the metallic bottom cover of the liquid-cooling vapor chamber has thereon at least one screw hole for mounting at least one heat-generating electronic element. The screw hole has formed correspondingly a screw-hole protrusion by recessing from the outer heat-absorption surface to the inner evaporation surface but not penetrating through. The height of the screw-hole protrusion is not higher than the height of the columnar supporting structures.

In one embodiment of the present disclosure, the liquid-cooling heat dissipation system has a plurality of liquid-cooling vapor chambers, for example, the quantity of the liquid-cooling vapor chamber in the liquid-cooling heat dissipation system can be two, three, or four, and the first coolant pipeline and the second coolant pipeline are manifold tubes having branches corresponding to the quantity of liquid-cooling vapor chambers, and the coolant circulation machine is a CDU (the coolant distribution unit).

In one embodiment of the present disclosure, the liquid-cooling cover, the metallic top cover, the metallic bottom cover, the heat dissipation bottom plate, and the heat dissipation outer cover of the liquid-cooling heat dissipation system are made of copper, aluminum, aluminum alloy or magnesium alloy.

In one embodiment of the present disclosure, the working fluid of the liquid-cooling heat dissipation system is water.

In one embodiment, the liquid-cooling heat dissipation plate of the present disclosure, wherein the outer cover sidewall includes a plurality of second liquid inlets and a plurality of second liquid outlets.

In one embodiment, the liquid-cooling heat dissipation plate of the present disclosure, wherein the quantity of the second liquid inlet and the second liquid outlet provided on the outer cover sidewall are respectively two, three or four.

In one embodiment of the present disclosure, the liquid-cooling heat dissipation plate is a plate-shaped structure with a length of 250 mm-600 mm, a width of 150 mm-450 mm, and a thickness of 10 mm-30 mm. In one embodiment of the present disclosure, the cooling liquid is water.

In one embodiment of the present disclosure, the cooling liquid is water having a total volume of around 1 liter~6 liters.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein:

FIG. 3 shows schematically the cross-section view of the liquid-cooling vapor chamber in the first implementation of the liquid-cooling heat dissipation system in accordance with the present disclosure;

DETAILED DESCRIPTION

Figure 1:
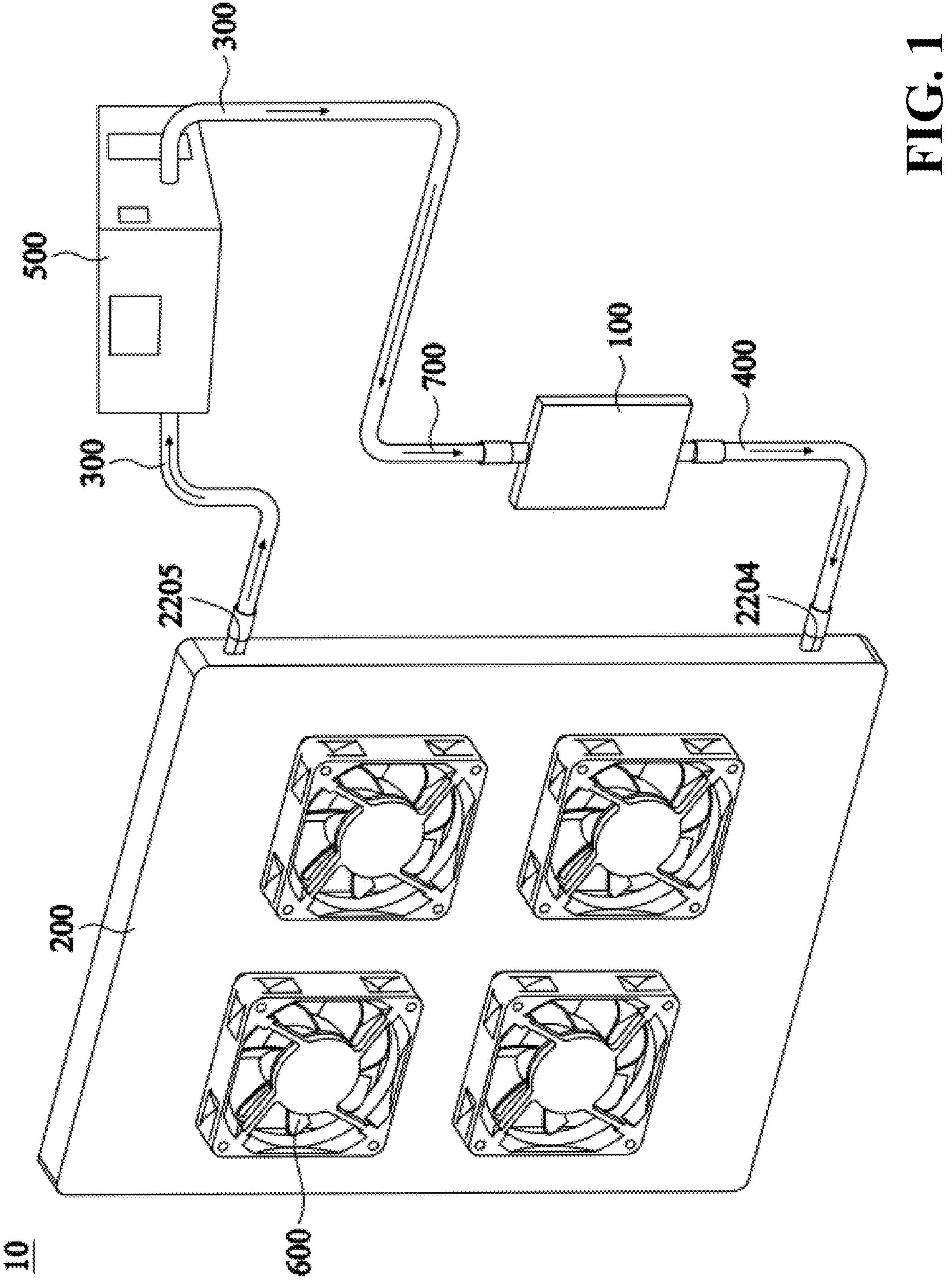
FIG. 1 shows schematically an embodiment of the structure of the liquid-cooling heat dissipation system in accordance with the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. In the following description and/or scope of patent application, the technical terms used should be interpreted with the usual meanings commonly used by those skilled in the art. For ease of understanding, the same elements in the following embodiments are referred to as the same symbols. In this specification, the term "about" usually means that the actual value is within plus or minus 10%, 5%, 1% or 0.5% of a specific value or range. The term "about" herein means also that the actual value falls within an acceptable standard error of the mean, as considered by one of ordinary skill in the art to which this invention pertains. Except for the examples, or unless otherwise expressly stated, it should be understood that ranges, amounts, values and percentages used herein are modified by "about". Therefore, unless otherwise stated, the numerical values or parameters disclosed in this specification and the appended patent claims are approximate numerical values and may be changed as required.

In the description of the present invention, it should be understood that the terms "length", "width", "thickness", "up", "down", "front", "back", "left", "right", "vertical", "horizontal", "top", "bottom", "inside", "outside", "axial", "radial", "circumferential" and the other indicated orientation or position relationship is based on the orientation or position relationship shown in the drawings, only for the convenience of describing the present invention and simplifying the description, not to indicate or imply that the device or element referred to must have a particular orientation, constructed and operated in a particular orientation, so it cannot be understood as a limitation of the present invention.

Referring to FIGS. 1, an embodiment of the structure of the liquid-cooling heat dissipation system in accordance with the present disclosure. In one embodiment, the liquid-cooling heat dissipation system 10 includes at least one liquid-cooling vapor chamber 100, a liquid-cooling heat dissipation plate 200, at least one first coolant pipeline 300, at least one second coolant pipeline 400, a coolant circulation machine 500, at least one fan 600, and a cooling liquid 700.

The six exemplary implementations of the present disclosure are illustrated in the following description. The differences among the first implementation to the fifth implementation lie in the different structural aspects of the liquid-cooling vapor chamber 100. The sixth implementation is another exemplarily another implementation of the liquid-cooling heat dissipation system.

The First Implementation

Figure 2:
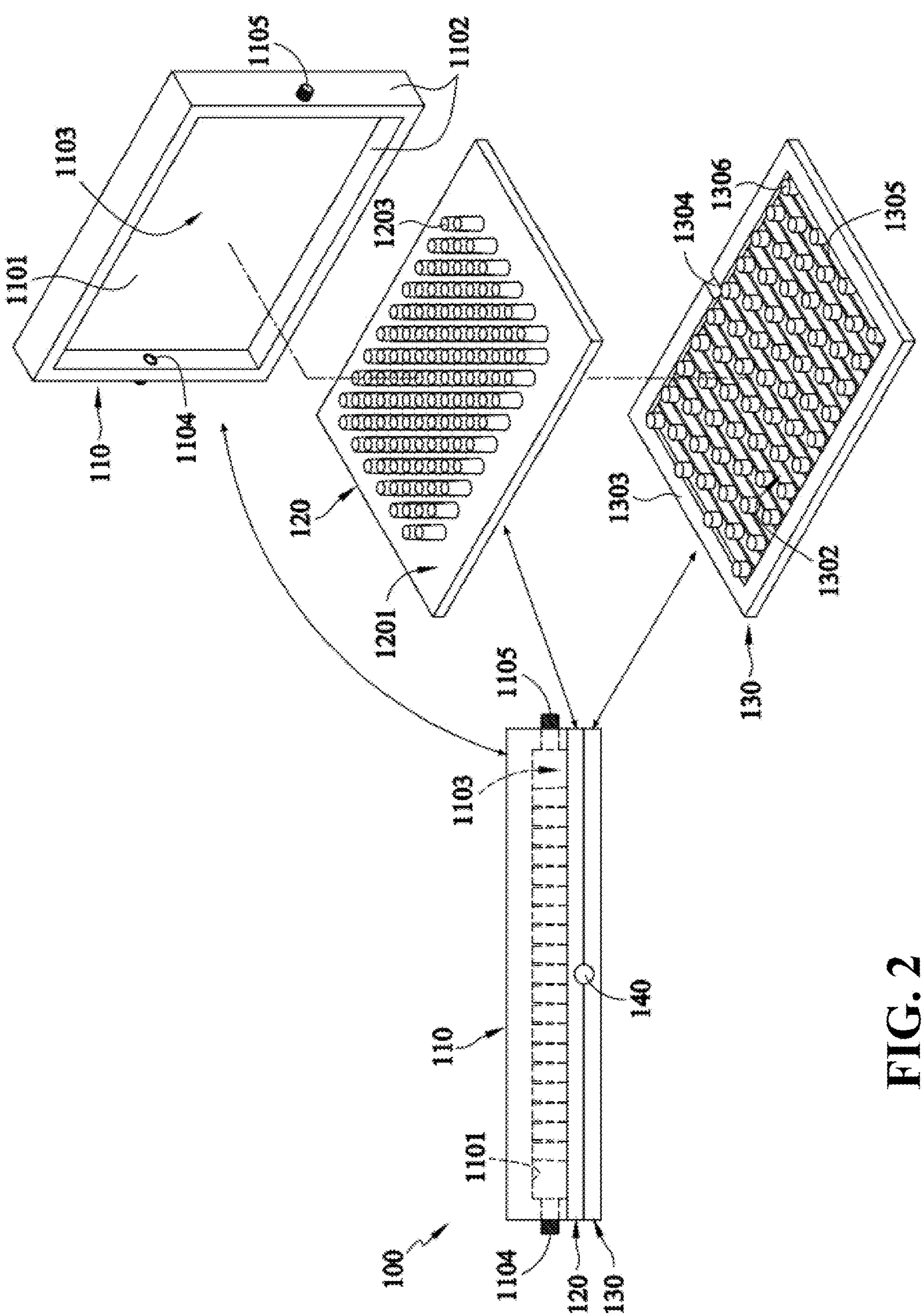
FIG. 2 shows schematically the structure of the liquid-cooling vapor chamber in the first implementation of the liquid-cooling heat dissipation system in accordance with the present disclosure.
Figure 3:
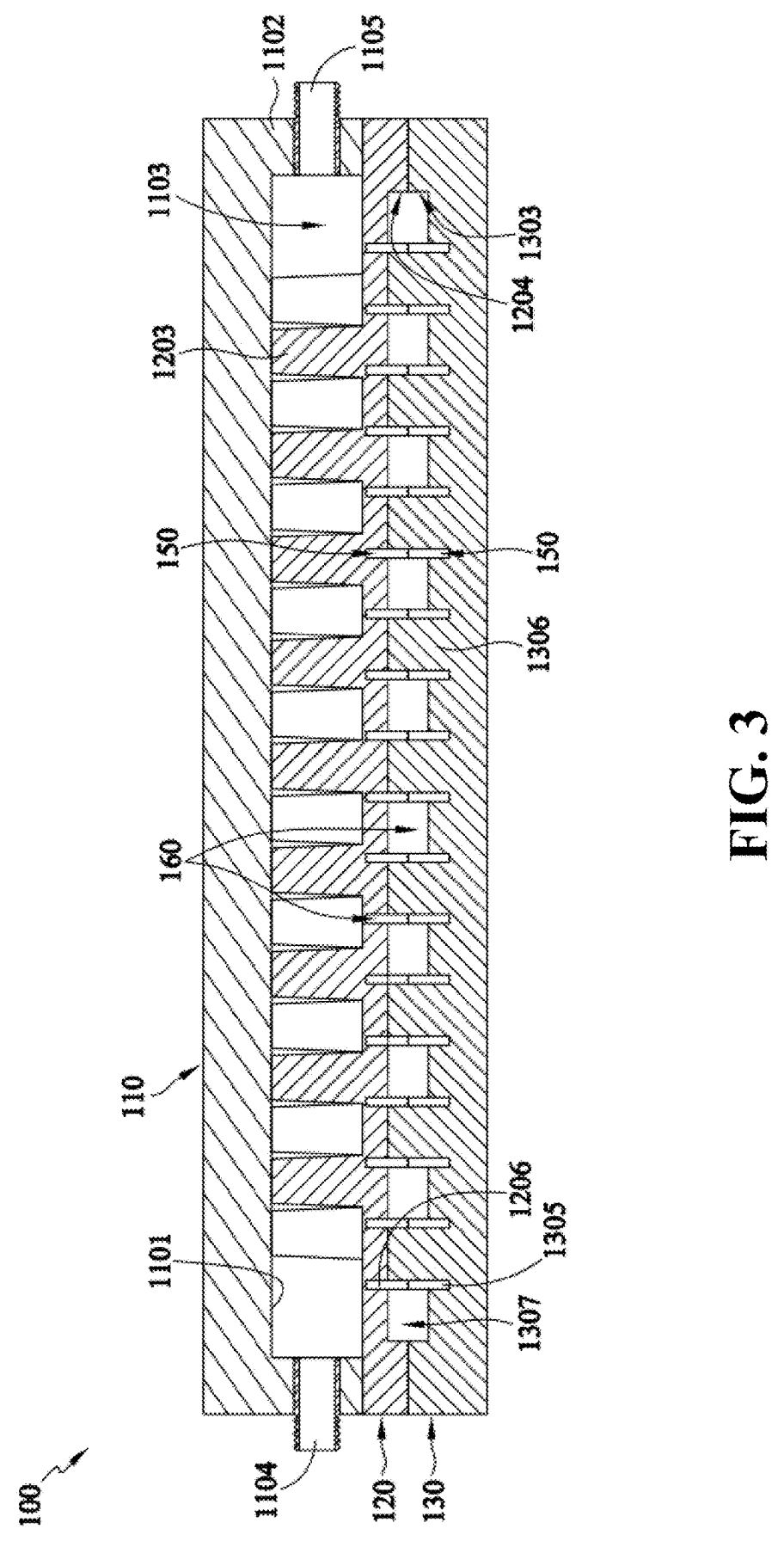
Figure 4:
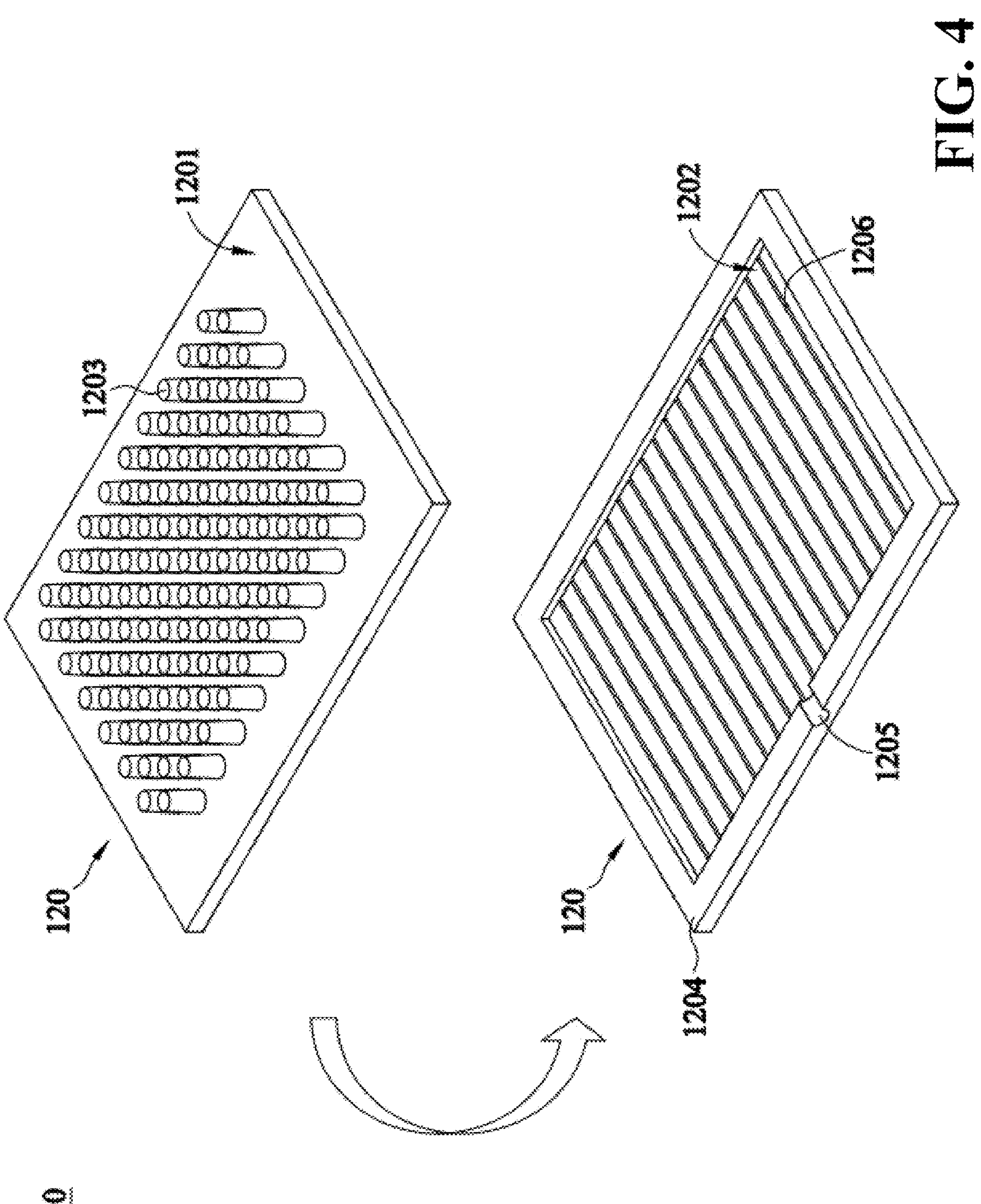
FIG. 4 shows schematically the structure of the metallic top cover of the liquid-cooling vapor chamber in the first implementation in accordance with the present disclosure.
Figure 5:
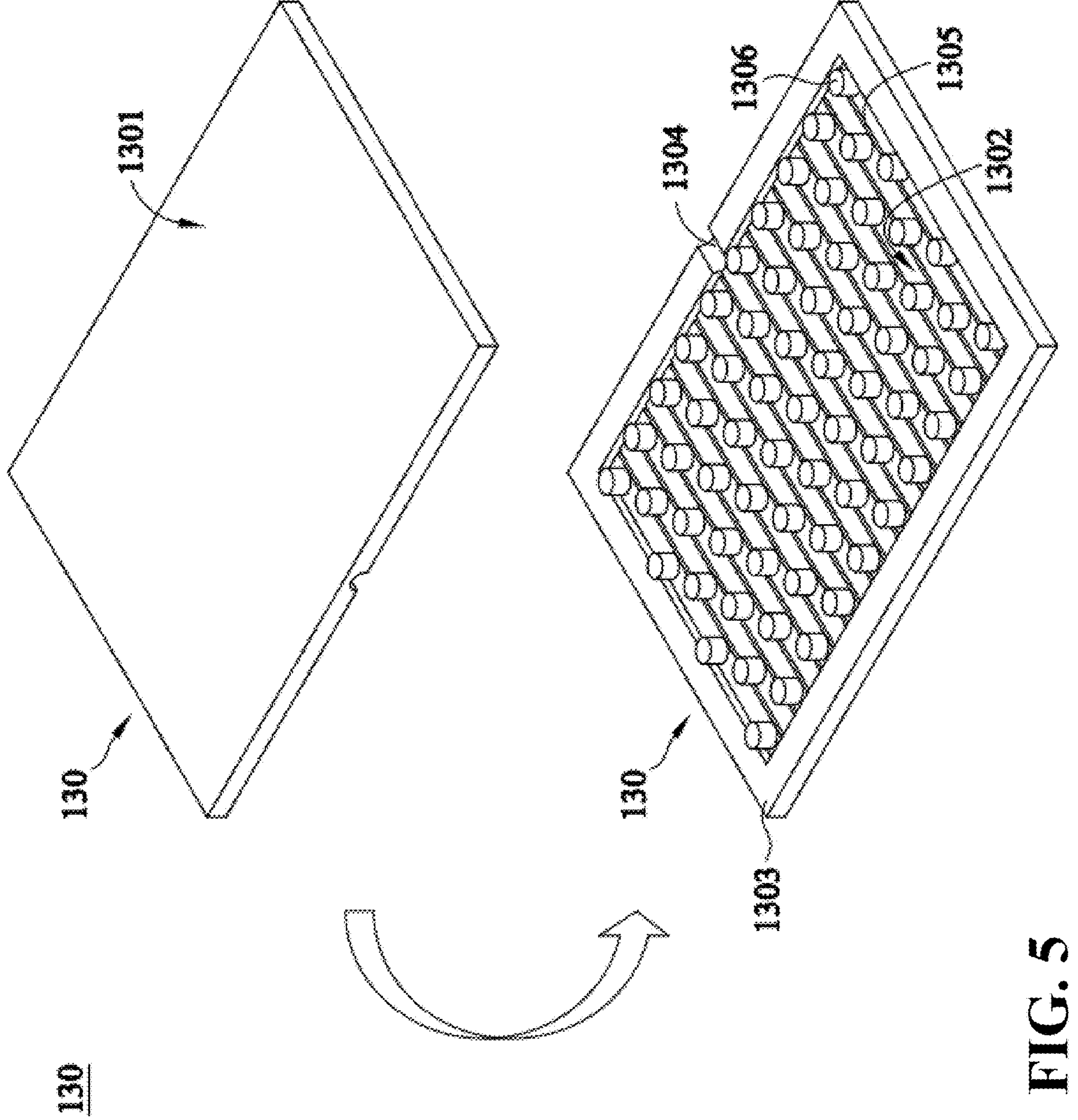
FIG. 5 shows schematically the structure of the metallic bottom cover of the liquid-cooling vapor chamber in the first implementation in accordance with the present disclosure.

Referring to FIGS. 2 to 5. FIG. 2 shows schematically the structure of the liquid-cooling vapor chamber 100 in the first implementation of the liquid-cooling heat dissipation system 10 in accordance with the present disclosure. FIG. 3 shows schematically the cross-section view of the liquid-cooling vapor chamber 100 of FIG. 2. FIG. 4 shows schematically the structure of the metallic top cover 120 of the liquid-cooling vapor chamber 100 in the first implementation of the liquid-cooling heat dissipation system 10 in accordance with the present disclosure. FIG. 5 shows schematically the structure of the metallic bottom cover 130 of the liquid-cooling vapor chamber 100 in the first implementation of the liquid-cooling heat dissipation system 10 in accordance with the present disclosure. In the first implementation of the liquid-cooling heat dissipation system 10 of the present disclosure, the liquid-cooling vapor chamber includes a liquid-cooling cover 110, a metallic top cover 120, a metallic bottom cover 130, a vacuum channel 140, a plurality of capillary structures 150, and a working fluid 160. The liquid-cooling cover 110 includes a top 1101 and a sidewall 1102 connecting to the top 1101. The sidewall 1102 surrounds the top 1101 to form a first accommodating space 1103. The sidewall 1102 is provided with at least one first liquid inlet 1104 and at least one first liquid outlet 1105. The first liquid inlet 1104 and the first liquid outlet 1105 are connected in the first accommodating space 1103. The metallic top cover 120 includes oppositely an outer heat-dissipating surface 1201 and an inner condensation surface 1202. The outer heat-dissipating surface 1201 has a plurality of first heat dissipation pillars 1203 protruding therefrom. The inner condensation surface 1202 is surrounded by a top frame 1204 with a predetermined height, and the top frame 1204 is furnished with an upper communicative groove 1205. The inner condensation surface 1202 has thereon a plurality of top grooves 1206 parallel to each other. The entire structure of the metallic top cover 120 including the first heat dissipation pillars 1203 is made as a unique piece from the same metal body. The metallic bottom cover 130 includes oppositely an outer heat-absorption surface 1301 and an inner evaporation surface 1302. The outer heat-absorption surface 1301 is used to contact a heat-generating element (not shown). The inner evaporation surface 1302 is surrounded by a bottom frame 1303 with another predetermined height, and the bottom frame 1303 is furnished with a lower communicative groove 1304. The inner evaporation surface 1302 has thereon a plurality of bottom grooves 1305 parallel to each other, a plurality of columnar supporting structures 1306 protruding therefrom and disposed between the bottom grooves 1305. The entire structure of the metallic bottom cover 130 including the plurality of columnar supporting structures 1306 is made as a unique piece from the same metal body. The working space 1307 is formed by engaging the top frame 1204 of the metallic top cover 120 and the bottom frame 1303 of the metallic bottom cover 130. The plurality of columnar supporting structures 1306 are protruding from the inner evaporation surface 1302 to contact individually at the inner condensation surface 1202 among the plurality of top grooves 1206 and providing support to the working space 1307. The vacuum channel 140 is formed by connecting spatially the upper communicative groove 1205 and the lower communicative groove 1304 so as provide a channel for vacuuming the working space 1307. After vacuuming, the vacuum channel 140 can then be sealed to keep the working space 1307 maintaining in a near vacuum state. The plurality of capillary structures 150 are disposed individually inside the plurality of bottom grooves 1305 or both top grooves 1206 and bottom grooves 1305. The working fluid 160 is in the working space 1307 and the plurality of capillary structures 150.

Figure 10:
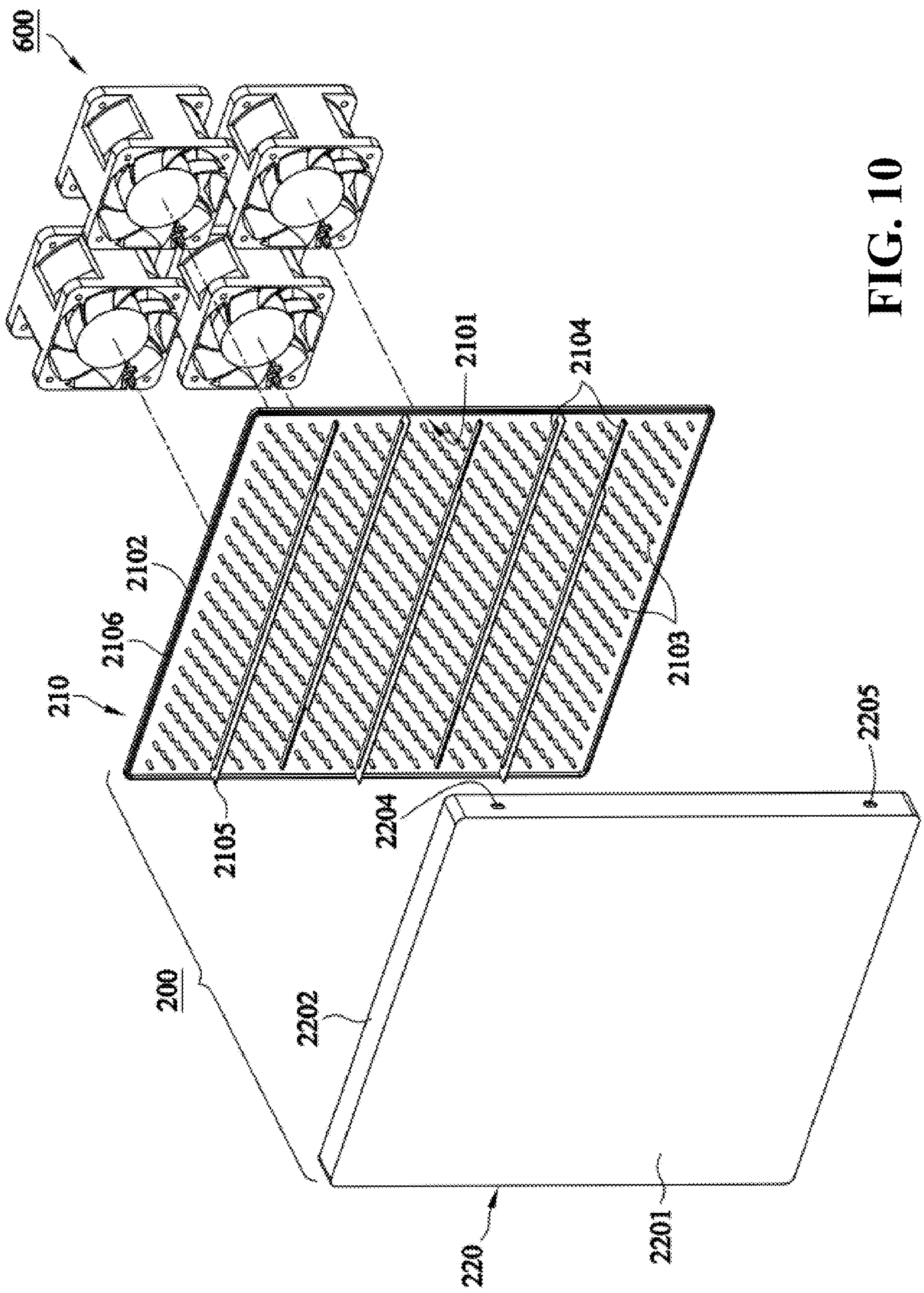
FIG. 10 shows schematically the structure of the liquid-cooling heat dissipation plate in accordance with an embodiment of the liquid-cooling heat dissipation system of the present disclosure.
Figure 11:
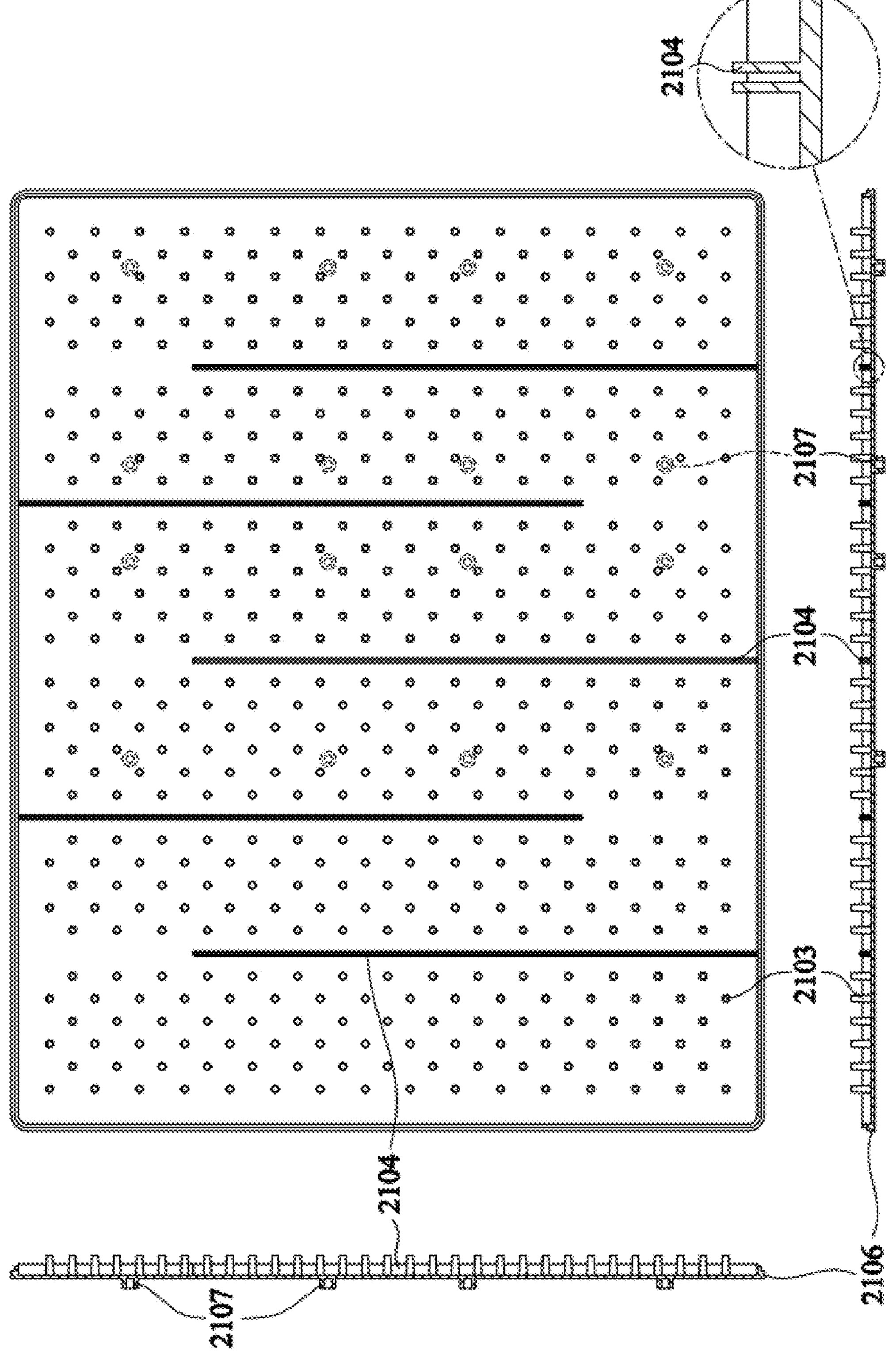
FIG. 11 shows schematically the top view and the side view of the heat dissipation bottom plate of the liquid-cooling heat dissipation plate in accordance with an embodiment of the present disclosure.
Figure 12:
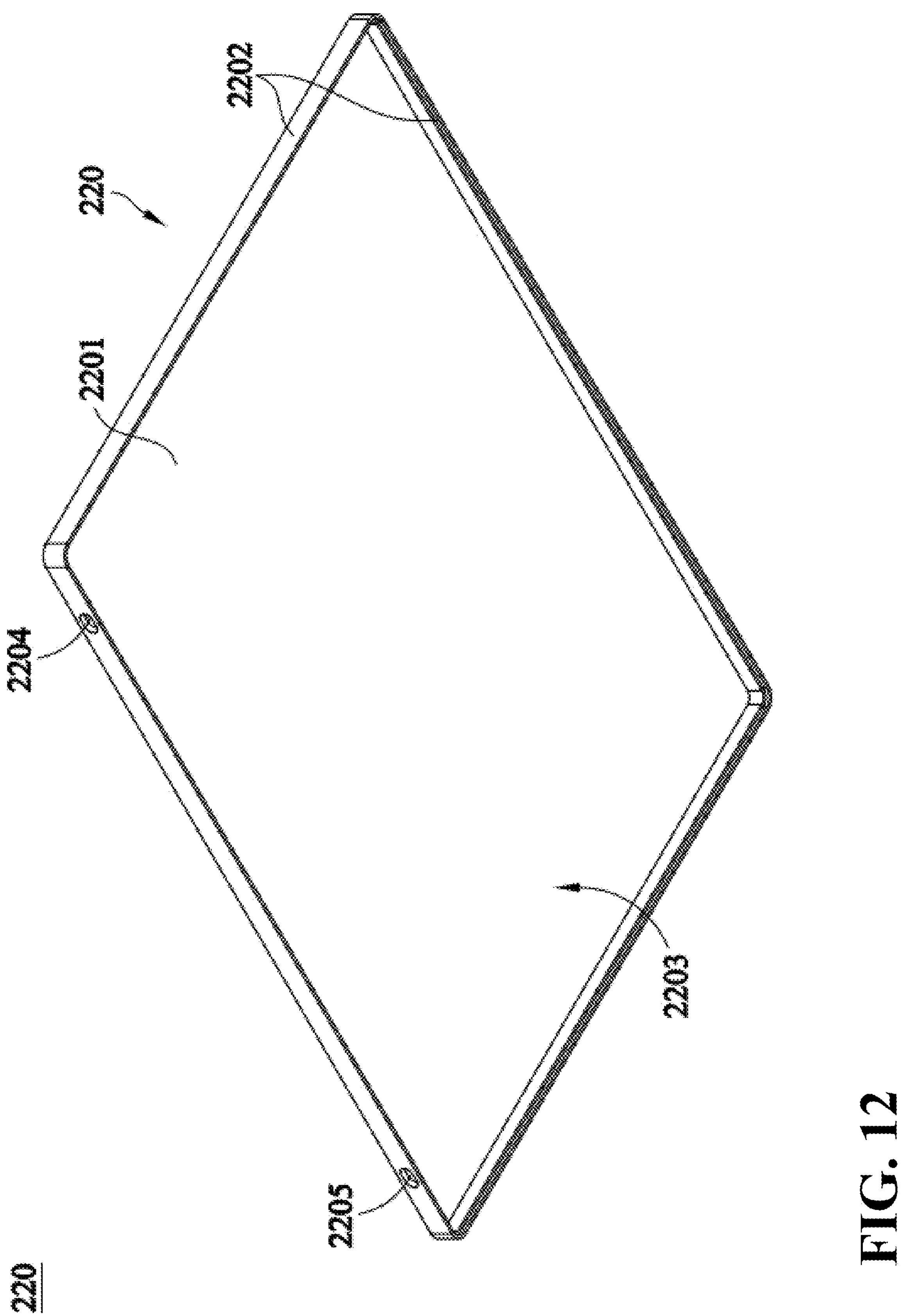
FIG. 12 shows schematically the structure of the heat dissipation outer cover of the liquid-cooling heat dissipation plate in accordance with an embodiment of the present disclosure.

Referring to FIGS. 10 to 12. FIG. 10 shows schematically the structure of the liquid-cooling heat dissipation plate 200 in accordance with an embodiment of the liquid-cooling heat dissipation system 10 of the present disclosure. FIG. 11 shows schematically the top view and the side view of the heat dissipation bottom plate 210 of the liquid-cooling heat dissipation plate 200 in accordance with an embodiment of the present disclosure. FIG. 12 shows schematically the structure of the heat dissipation outer cover 220 of the liquid-cooling heat dissipation plate 200 in accordance with an embodiment of the present disclosure. In the first implementation of the liquid-cooling heat dissipation system 10 of the present disclosure, the liquid-cooling heat dissipation plate 200 includes a heat dissipation bottom plate 2101 and a heat dissipation outer cover 220. Referring to FIGS. 10 and 11, the heat dissipation bottom plate 210 has a bottom plate inner surface 2101 and oppositely a bottom plate outer surface 2102. The bottom plate inner surface 2101 has a plurality of second heat dissipation pillars 2103 protruding therefrom arranging in roughly a matrix manner. The bottom plate inner surface 2101 has at least one flow guide slot 2104 protruding therefrom with a long-groove shape disposing between the plurality of second heat dissipation pillars 2103 for inserting at least one flow guide 2105 having a long-sheet shape. An outer cover insertion slot 2106 is protrudingly provided along the edge of the bottom plate inner surface 2101. A plurality of fan screw holes 2107 are protrudingly provided on the bottom plate outer surface 2102 for mounting at least one fan 600 to provide forced air-blow to the bottom plate outer surface 2102 for cooling. Wherein the entire structure of the heat dissipation bottom plate 210 including the plurality of second heat dissipation pillars 2103, the flow guide slot 2104, the outer cover insertion slot 2106, and the fan screw holes 2107 is made as a unique piece from the same metal body (metal sheet or metal block) by one-piece molding. In one embodiment of the present disclosure, the quantity of the flow guide slot 2104 can be provided according to the application requirements, for example, it can be one, two, three, four, five, six, seven or eight, and equipped with a corresponding number of the flow guide 2105. For example, as shown in FIGS. 10 and 11, the quantity of the flow guide slot 2104 is five, and five long-sheet shape flow guides 2105 are inserted and installed in these five the flow guide slots 2104.

Referring to FIGS. 10 to 12. In this embodiment, the heat dissipation outer cover 220 has an outer cover top 2201 and an outer cover sidewall 2202 connected to the outer cover top 2201. The outer cover sidewall 2202 surrounds the outer cover top 2201 to form a second accommodation space 2203. The outer cover sidewall 2202 is provided with at least one second liquid inlet 2204 and at least one second liquid outlet 2205. The second liquid inlet 2204 and the second liquid outlet 2205 are connected to the second accommodation space 2203. Wherein, when the heat dissipation outer cover 220 and the heat dissipation bottom plate 210 are engaged to each other, the outer cover sidewall 2202 of the heat dissipation outer cover 220 is inserted into the outer cover insertion slot 2106 of the heat dissipation bottom plate 210 and then welded, and the plurality of second heat dissipation pillars 2103 are disposed in the second accommodation space 2203, to form the liquid-cooling heat dissipation plate 200 of the present disclosure. In one embodiment of the present disclosure, the quantity of the second liquid inlet 2204 and the second liquid outlet 2205 can be provided according to the application requirements, for example, it can be one, two, three, four, five or six. It should be noted that increasing the quantity of the second liquid inlet 2204 and the second liquid outlet 2205 allows the liquid-cooling heat dissipation plate 200 to connect to more amount of liquid-cooling vapor chamber 100. In addition, by the use of manifold (or coolant distribution manifold; CDM), increasing the quantity of the second liquid inlet 2204 and the second liquid outlet 2205 can also increase the volume flow rate of the cooling liquid 700 so that the heat dissipation ability of the liquid-cooling heat dissipation plate 200 is also increased.

Referring to FIG. 1, in the first implementation, the liquid-cooling heat dissipation system 10 of the present disclosure, wherein the first coolant pipeline 300 has one end connected to the first liquid inlet 1104 of the liquid-cooling vapor chamber 100 and the other end connected to the second liquid outlet 2205 of the liquid-cooling heat dissipation plate 200, and the second coolant pipeline 400 has one end connected to the first liquid outlet 1105 of the liquid-cooling vapor chamber 100 and the other end connected to the second liquid inlet 2204 of the liquid-cooling heat dissipation plate 200. In one embodiment of the present disclosure, wherein the coolant circulation machine 500 is disposed in between the first coolant pipeline 300 or the second coolant pipeline 400 for pumping and transmission the cooling liquid 700 (coolant), in order to make the cooling liquid 700 to circulate between the liquid-cooling vapor chamber 100 and the liquid-cooling heat dissipation plate 200 to form the liquid-cooling heat dissipation system 10.

In the first implementation, the liquid-cooling vapor chamber 100 of the liquid-cooling heat dissipation system 10 of the present disclosure, wherein the outer heat-absorption surface 1301 of the metallic bottom cover 130 is a flat surface for contacting the heat-generating electronic element (s).

The Second Implementation

Figures 6A, 6B:
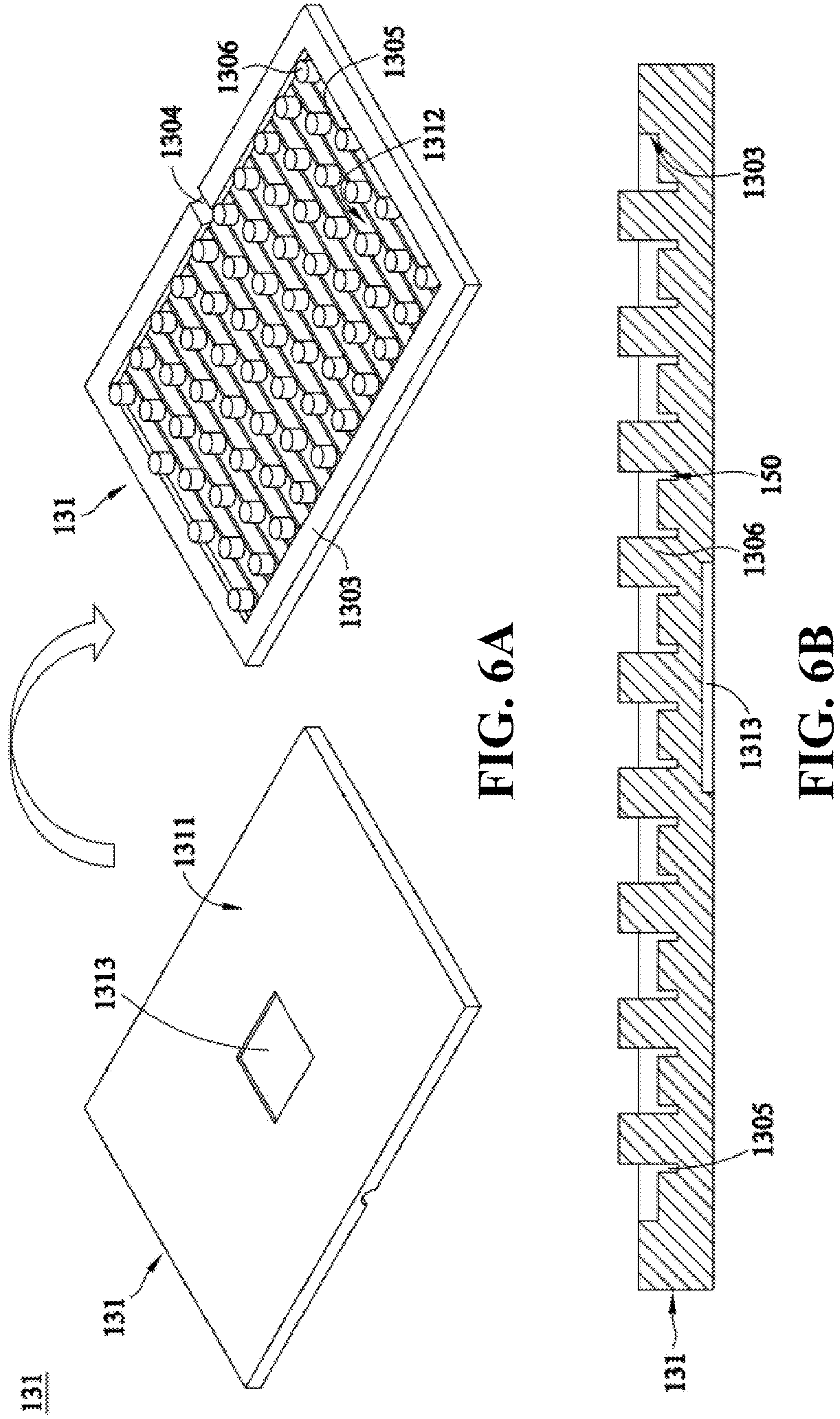
FIGS. 6A and 6B show schematically the structure and the cross-section of the metallic bottom cover of the liquid-cooling vapor chamber in the second implementation in accordance with the present disclosure.

Referring to FIGS. 6A and 6B. FIGS. 6A and 6B show schematically the structure and the cross-section of the metallic bottom cover 131 of the liquid-cooling vapor chamber 100 in the second implementation in accordance with the present disclosure. As shown, in the second implementation, the outer heat-absorption surface 1311 of the metallic bottom cover 131 further has at least one recessed space 1313 for accommodating at least one heat-generating electronic element, wherein the recessed space 1313 is a concave structure on the outer heat-absorption surface 1311, without a corresponding convex structure on the inner evaporation surface 1312. This is the difference between the first implementation and the second implementation. In one embodiment, the liquid-cooling vapor chamber 100 has a thickness, from the outer heat-dissipating surface 1201 to the outer heat-absorption surface 1311 (not including the first heat dissipation pillars 1203), not exceeding 6 mm. In yet another embodiment, the above-mentioned thickness is not exceeding 5 mm, 4 mm, or not exceeding 3.5 mm. It should be noted that, in one embodiment, the shape and volume of the recessed space 1313 provided on the outer heat-absorption surface 1311 of the metallic bottom cover 131 can be determined according to the shape and volume of the heat-generating electronic component to which it is attached. The design of the recessed space 1313 has the following advantages: (1). The heat-generating electronic component can be accommodated in the recessed space 1313 (or partially accommodated in the recessed space 1313), so that the contact between the heat-generating electronic component and the liquid-cooling vapor chamber 100 is closer and the contact area (lateral contact area) is larger, thus the heat dissipation efficiency is improved. (2). The heat-generating electronic component is accommodated in the recessed space 1313 so that the overall thickness can be reduced.

The Third Implementation

Figures 7A, 7B:
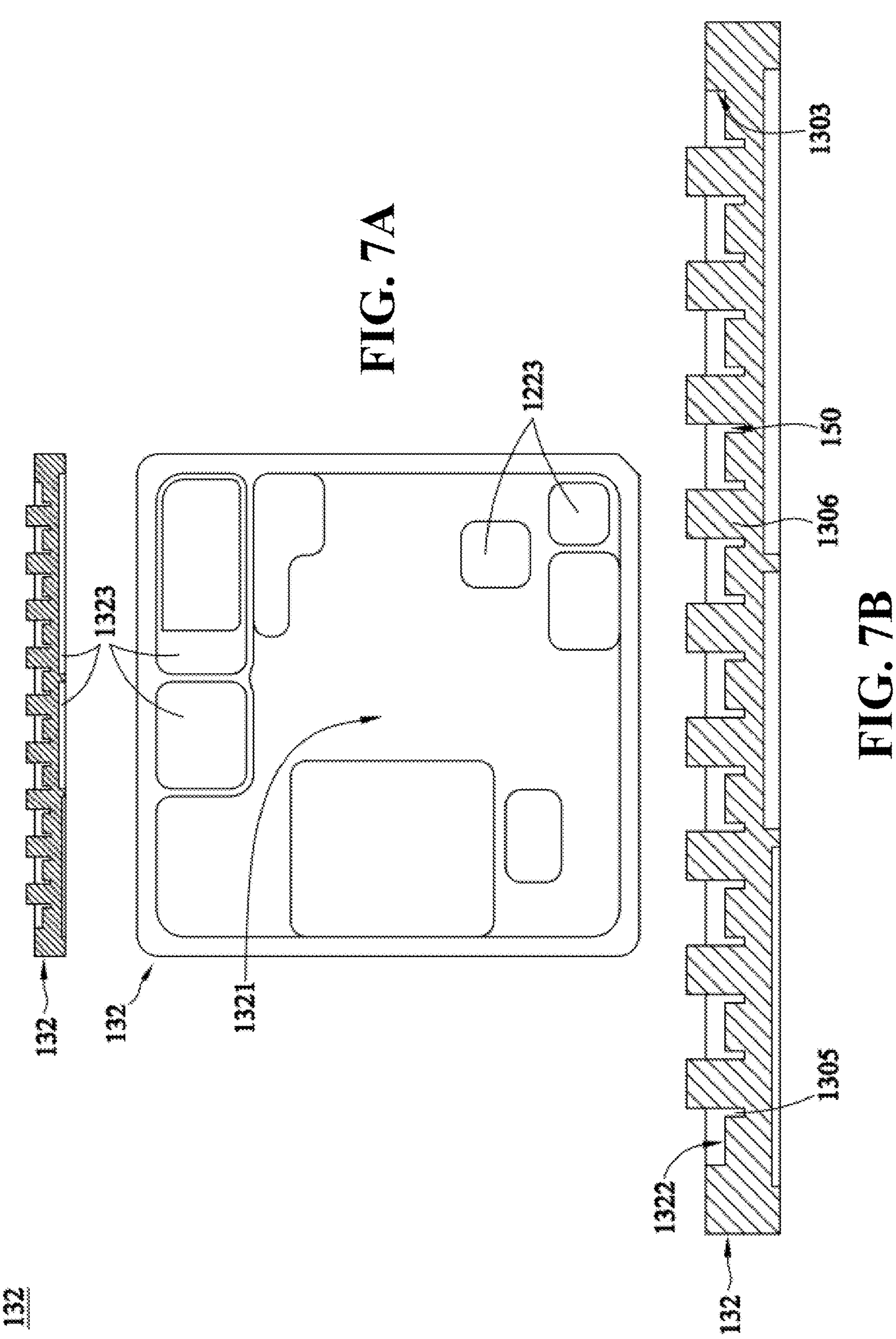
FIGS. 7A and 7B show schematically the structure and the cross-section of the metallic bottom cover of the liquid-cooling vapor chamber in the third implementation in accordance with the present disclosure.

Referring to FIGS. 7A and 7B. FIGS. 7A and 7B show schematically the structure and the cross-section of the metallic bottom cover 132 of the liquid-cooling vapor chamber 100 in the third implementation in accordance with the present disclosure. As shown, in the third implementation, the outer heat-absorption surface 1321 of the metallic bottom cover 132 further has a plurality of recessed spaces 1323 for accommodating a plurality of heat-generating elements, wherein the recessed spaces 1323 are concave structures on the outer heat-absorption surface 1322, without corresponding convex structures on the inner evaporation surface 1322. In this embodiment, the liquid-cooling vapor chamber 100 has a thickness, from the outer heat-dissipating surface 1201 to the outer heat-absorption surface 1321 (not including the first heat dissipation pillars 1203), not exceeding 6 mm. In yet another embodiment, the above-mentioned thickness is not exceeding 5 mm, 4 mm, or not exceeding 3.5 mm. It should be noted that the purpose to have the plurality of recessed spaces 1323 provided on the outer heat-absorption surface 1321 of the metallic bottom cover 132 is for the application of the small chip packaging (i.e. the chiplet packaging) that are gradually becoming mainstream manufacturing method. The chiplet packaging means to integratedly package several or even dozens of chips having the same or different function, sizes, volumes together by packaging technology. However, when several or even dozens of chips are packaged together in the small space, the connection lines between them are extremely short and the operating frequency is high, the heat generated and the heat density are therefore tremendously higher than ever. The heat dissipation problem will be more difficult. In the third implementation of the present disclosure, the plurality of recessed spaces 1323 on the outer heat-absorption surface 1321 of the metallic bottom cover 132 can be designed and made according to the overall size, peripheral, volume of the chiplet after packaging, so that the packaged chiplet can be more closely attached and accommodated in the plurality of recessed spaces 1323. With the use of the liquid-cooling vapor chamber 100 having rapid lateral heat diffusion rate and high heat dissipation efficiency, coupled with the first heat dissipation pillars 1203 having increased the heat-exchange efficiency, and the cooling liquid 700, the heat dissipation problem of the chiplet can be effectively solved. It should be noted that, in one embodiment, the plurality of recessed spaces can be provided with the same or different shape and volume in order to simultaneously accommodate a plurality of heat-generating elements having the same or different shape or volume, as shown in FIG. 7A.

The Fourth Implementation

Figures 8A, 8B:
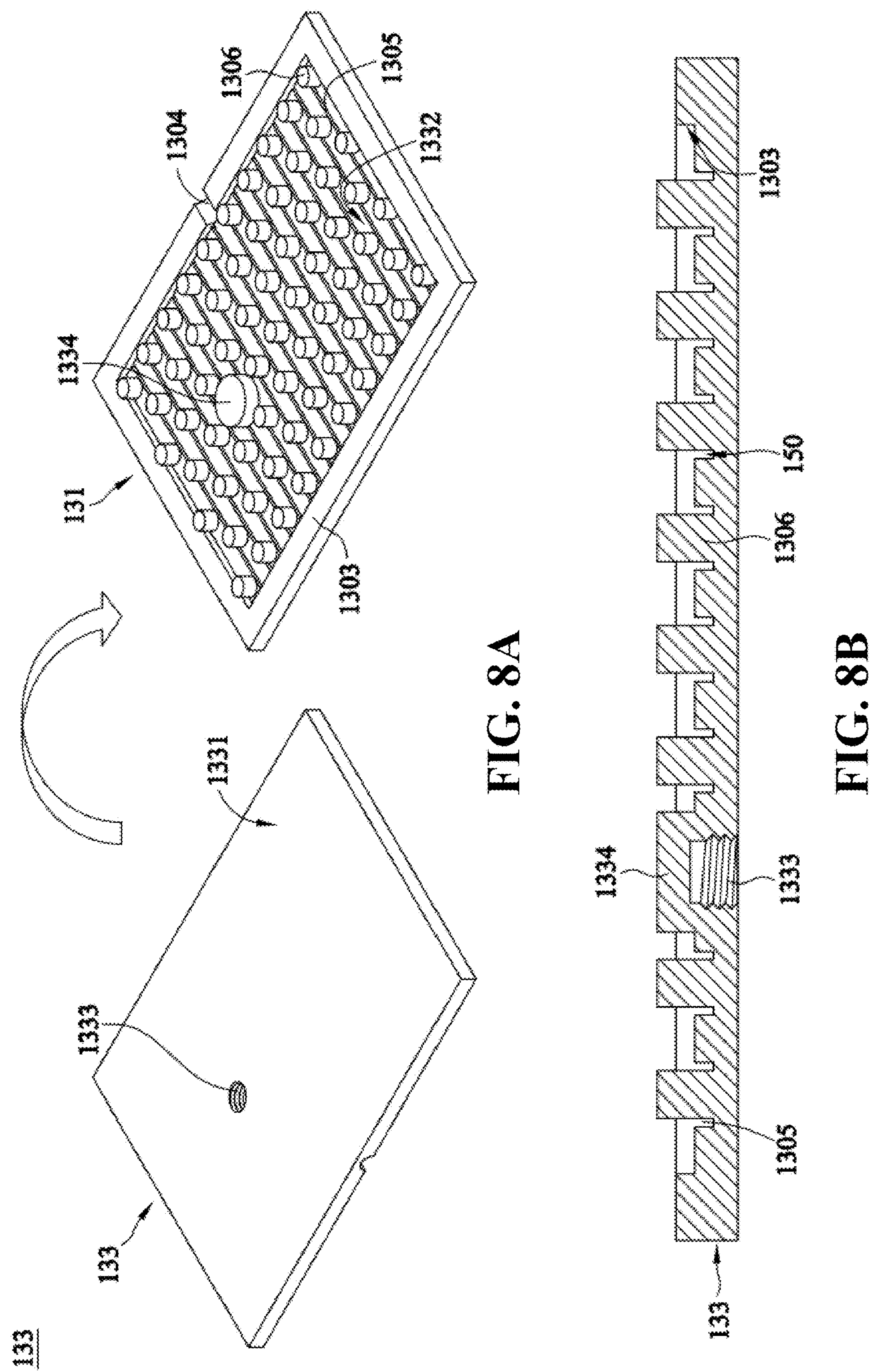
FIGS. 8A and 8B show schematically the structure and the cross-section of the metallic bottom cover of the liquid-cooling vapor chamber in the fourth implementation in accordance with the present disclosure.

Referring to FIGS. 8A and 8B. FIGS. 8A and 8B show schematically the structure and the cross-section of the metallic bottom cover 133 of the liquid-cooling vapor chamber 100 in the fourth implementation in accordance with the present disclosure. As shown, in the fourth implementation, the outer heat-absorption surface 1331 of the metallic bottom cover 133 has thereon at least one screw hole 1333 for mounting at least one heat-generating electronic element, wherein the screw hole 1333 has formed correspondingly a screw-hole protrusion 1334 by recessing from the outer heat-absorption surface 1331 to the inner evaporation surface 1332 but not penetrating through. The height of the screw-hole protrusion 1334 is not higher than the height of the columnar supporting structures 1306. It is worth noted that, in order to allow the chip (the heat-generating element) to be in closer contact with the metallic bottom cover 133 of the liquid-cooling vapor chamber 100, in one embodiment, at least one screw hole 1333 is provided on the outer heat-absorption surface 1331 of the metallic bottom cover 133. Thus, the chip can be mounted on the outer heat-absorption surface 1331 without using thermal paste, the heterogeneous interface with low thermal conductivity, to adhere the chip to the outer heat-absorption surface 1331. The heat dissipation efficiency can therefore be improved.

The Fifth Implementation

Figure 9A:
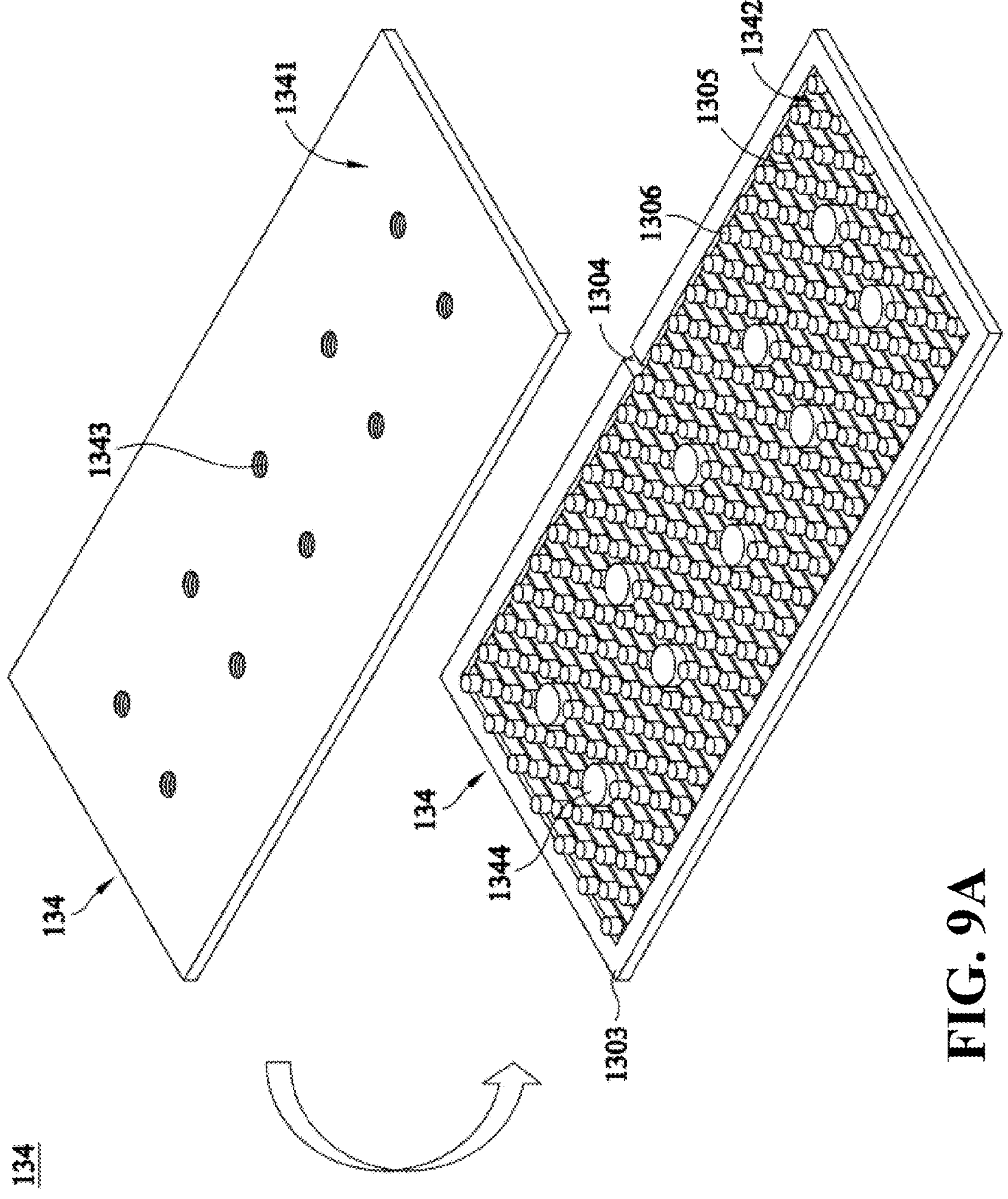
FIGS. 9A and 9B show schematically the structure and the cross-section of the metallic bottom cover of the liquid-cooling vapor chamber in the fifth implementation in accordance with the present disclosure.
Figure 9B:
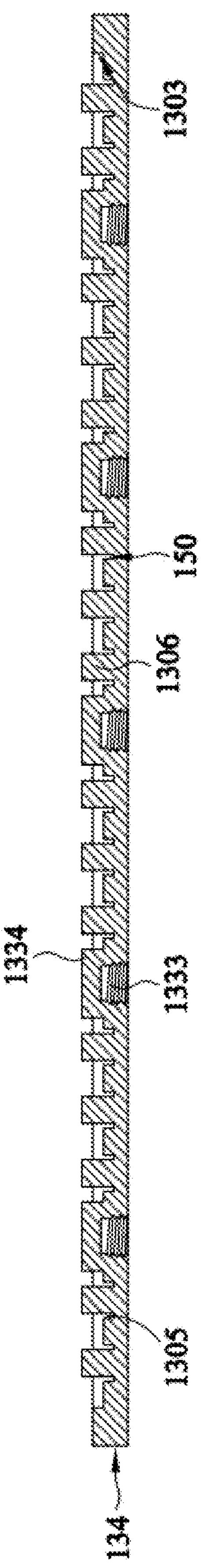

Referring to FIGS. 9A and 9B. FIGS. 9A and 9B show schematically the structure and the cross-section of the metallic bottom cover 134 of the liquid-cooling vapor chamber 100 in the fifth implementation in accordance with the present disclosure. As shown, in the fifth implementation, the outer heat-absorption surface 1341 of the metallic bottom cover 134 has thereon a plurality of screw holes 1343 for mounting a plurality of heat-generating electronic elements, wherein the plurality of screw holes 1343 have formed correspondingly a plurality of screw-hole protrusion 1344 by recessing from the outer heat-absorption surface 1341 to the inner evaporation surface 1342 but not penetrating through. The height of the screw-hole protrusion 1344 is not higher than the height of the columnar supporting structures 1306. In one embodiment of the present disclosure, the quantity of the screw holes 1343 can be provided according to the application requirements, for example, it can be two, three, four, five, six, seven, eight, nine, ten, eleven or twelve. As shown in FIG. 9A, the quantity of the screw hole 1343 is ten and can be used to mount ten heat-generating electronic elements.

The Sixth Implementation

Figure 13:
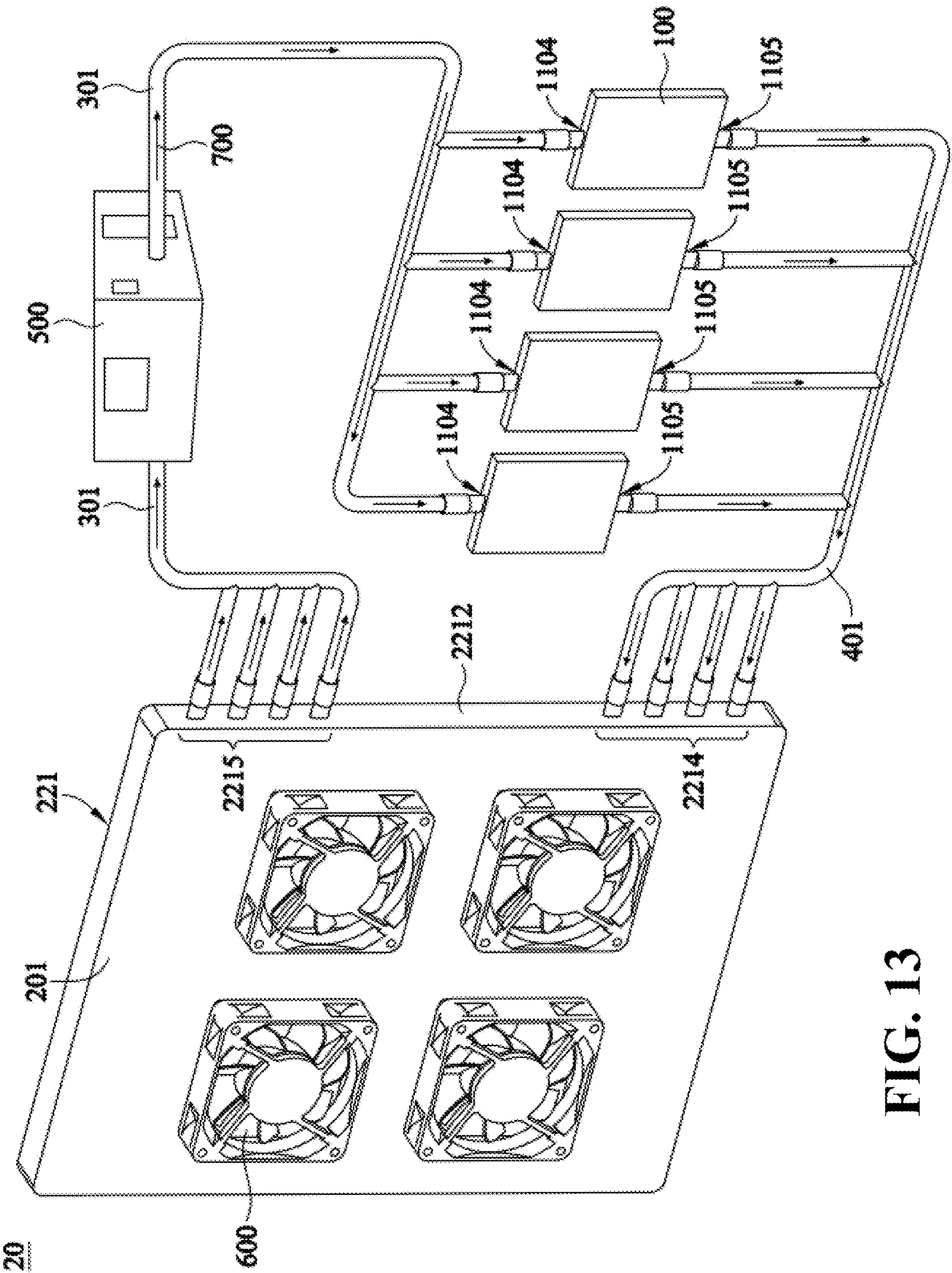
FIG. 13 shows schematically another embodiment of the structure of the liquid-cooling heat dissipation system in accordance with the present disclosure.

Referring to FIG. 13. FIG. 13 shows schematically another embodiment of the structure of the liquid-cooling heat dissipation system 20 in accordance with the present disclosure. As shown, in the sixth implementation, the liquid-cooling heat dissipation system 20 includes four of the liquid-cooling vapor chambers 100, a liquid-cooling heat dissipation plate 201 having four of the second liquid inlet 2214 and four of the second liquid outlet 2215, a first coolant pipeline 201 which is a manifold tube having four branches, a second coolant pipeline 401 which is another manifold tube with four branches, a coolant circulation machine 500 (or a coolant distribution unit, CDU), four fans 600 that are mounted on the bottom plate outer surface 2102 of the heat dissipation bottom plate 210 of the liquid-cooling heat dissipation plate 210 through the fan screw holes, and a cooling liquid 700. In one embodiment, each of the first liquid inlet 1104 of the four liquid-cooling vapor chambers 100 is connected to the four second liquid outlets 2215 of the liquid-cooling heat dissipation plate 200 through each of the four branches of the first coolant pipeline 301. Each of the first liquid outlet 1105 of the four liquid-cooling vapor chambers 100 is connected to the four second liquid inlets 2214 of the liquid-cooling heat dissipation plate 200 through each of the four branches of the second coolant pipeline 401. In one embodiment, the coolant circulation machine 500 is disposed in between the first coolant pipeline 301 connecting the second liquid outlets 2215 of the liquid-cooling heat dissipation plate 201 and each of the first liquid inlets 1104 of the four liquid-cooling vapor chambers 100. In other words, the coolant circulation machine 500 is inserted in between the first coolant pipeline 301. The coolant circulation machine 500 pumps in order to transport the cooling liquid 700 flowing into the first accommodation space 1103 of each liquid-cooling vapor chamber 100 for heat exchange. After absorbing the heat, the cooling liquid 700 flows out of the first accommodation space 1103 and then flows through the second coolant pipeline 401 and into the second accommodation space 2203 of the liquid-cooling heat dissipation plate 201. When the cooling liquid 700 flows within the liquid-cooling heat dissipation plate 201, the plurality of fans 600 provide forced air-blow to the liquid-cooling heat dissipation plate 201 to dissipate the heat, and by thus to cool down the liquid-cooling heat dissipation plate 201 and the cooling liquid 700.

It should be understood that, as shown in FIG. 13, the plurality of the liquid-cooling vapor chamber 100 used in the sixth implementation can be the same or different from each other in terms of structure or size. For example, the liquid-cooling vapor chamber 100 can include any one of the metallic bottom plates (130, 131, 132, 133, 134) of the first to the sixth implementations depending on the application situation. Each of the liquid-cooling vapor chamber 100 can be simultaneously applied on the same or differently chiplet or heat-generating electronic elements. Thus, the total heat absorbed by the plurality of the liquid-cooling vapor chambers 100 is varied upon the application conditions, the total volume of the cooling liquid 700 used should also be varied upon which. The coolant circulation machine 500 (or CDU) can control and adjust the flow rate of the cooling liquid 700 flowing into each liquid-cooling vapor chamber 100 according to the practical temperature of each liquid-cooling vapor chamber 100. This can more accurately control the temperature of the chiplet or heat-generating electronic components. In one embodiment, the quantity of the liquid-cooling vapor chamber 100 used is two, three or four, and the first coolant pipeline 301 and the second coolant pipeline 401 are manifold tubes with the corresponding numbers of the branches.

In addition, by the use of manifold tube(s), the quantity of the liquid-cooling vapor chamber 100 can be the same or different from the quantity of the second liquid inlet 2214 and the second liquid outlet 2215 of the liquid-cooling heat dissipation plate 201.

In one embodiment of the liquid-cooling heat dissipation system 10 (20), the liquid-cooling cover 110, the metallic top cover 120, the metallic bottom cover (130, 131, 132, 133, 134), the heat dissipation bottom plate 210 and the heat dissipation outer cover 220, 221 are made of copper, aluminum, aluminum alloy, or magnesium alloy.

In one embodiment of the present disclosure, the working liquid 160 is water.

In one embodiment, the liquid-cooling heat dissipation plate 210 of the present disclosure, wherein the outer cover sidewall 2202 includes a plurality of second liquid inlets 2214 and a plurality of second liquid outlets 2215.

In one embodiment, the liquid-cooling heat dissipation plate 200 of the present disclosure, wherein the quantity of the second liquid inlet 2214 and the second liquid outlet 2215 provided on the outer cover sidewall are respectively two, three or four.

In one embodiment of the present disclosure, the liquid-cooling heat dissipation plate 200 is a plate-shaped structure with a length of 250 mm-600 mm, a width of 150 mm-450 mm, and a thickness of 10 mm-30 mm.

In one embodiment, the cooling liquid 700 in the heat dissipation system 10 (20) of the present disclosure is water. In another embodiment, the cooling liquid 700 used in the liquid-cooling heat dissipation system 10 (20) of the present disclosure is water, especially softened water to avoid scale formation after being using for a long period of time. In other embodiments, an antifreeze agent (such as ethylene glycol) can be selectively added to the cooling liquid 700 depending on application conditions to prevent the cooling liquid 700 from solidifying and losing its function when the ambient temperature is below freezing point.

In one embodiment, the liquid-cooling heat dissipation system 10 (20) of the present disclosure, wherein the cooling liquid 700 is water having a total volume of around 1 liter to 6 liters. It should be noted that, in the liquid-cooling heat dissipation system 10 (20), the size, volume, the quantity and the size of the second liquid inlet 2214 and the second liquid outlet 2215, the quantity of the flow guide slot 2104 and the flow guide 2105 of the liquid-cooling heat dissipation plate 200 can be designed in accordance with the amount of heat generated in the practical application. Also, the total volume of cooling liquid 700 needed is varied depending on the practical condition. The larger volume of the cooling liquid 700 used can absorb more heat.

Certainly, each of the above-mentioned embodiments is only for illustration and not limiting the scope of the present disclosure, and any equivalent modification or change made according to the liquid-cooling heat dissipation system 10, 20 of the above-mentioned embodiments shall still be included in the patent scope of the present disclosure.

It is worth mentioning that 2024 is known as the beginning year of AIPC. Industries believe that regardless of commercial or consumer computers, there will be a need to operate generative AI. This will become a key turning point for generative AI to move from "cloud" to the "edge end". The great amount of "computing power" of AI chip modules will lead to higher and higher power consumption and generate a lot of heat at the same time. Thus, more effective heat dissipation systems/modules are needed to improve the heat dissipation efficiency.

AI computers can be regarded as upgraded versions of PCs. However, currently most CPUs or GPUs of PCs are using air-cooling radiators, or adapting in the form of AI servers and use cabinets with liquid-cooling modules to enhance heat dissipation efficiency. The liquid-cooling heat dissipation system proposed in the present disclosure is a high cooling efficiency liquid-cooling system that can be applied to an AI computer individually. Compared with air cooling, it has the following advantages:

1. High heat dissipation efficiency: Liquid coolant can quickly absorb and transport large amounts of heat, providing better cooling performance than traditional air cooling.
2. Low noise: Compared with air-cooling systems with high-speed cooling fans, liquid-cooling is generally quieter, and can provide a low-noise working environment.
3. Reduce energy consumption: Liquid-cooling heat dissipation is more effective than air-cooling heat dissipation in reducing the temperature of working systems, helping the systems to operate at a steady and lower temperature, and by thus to improve the energy efficiency.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A liquid-cooling heat dissipation system, comprising: a liquid-cooling heat dissipation plate, at least one liquid-cooling vapor chamber, at least one first coolant pipeline, at least one second coolant pipeline, a coolant circulation machine, at least one fan, and a cooling liquid; wherein the liquid-cooling vapor chamber includes:

a liquid-cooling cover, including a top and a sidewall connecting to the top, the sidewall surrounds the top to form a first accommodating space; the sidewall includes at least one first liquid inlet and at least one liquid outlet, the first liquid inlet and the first liquid outlet being connected in the first accommodating space;

a metallic top cover, including oppositely an outer heat-dissipating surface and an inner condensation surface; the outer heat-dissipating surface has a plurality of the first heat dissipation pillars protruding therefrom; the inner condensation surface is surrounded by a top frame with a predetermined height; the top frame is furnished with an upper communicative groove; the inner condensation surface has thereon a plurality of top grooves parallel to each other; wherein the entire structure of the metallic top cover including the first heat dissipation pillars is made as a unique piece from the same metal body;

a metallic bottom cover, including oppositely an outer heat-absorption surface and an inner evaporation surface; the outer heat-absorption surface is used to contact a heat-generating element; the inner evaporation surface is surrounded by a bottom frame with another predetermined height; the bottom frame is furnished with a lower communicative groove; the inner evaporation surface has thereon a plurality of bottom grooves parallel to each other and a plurality of columnar supporting structures protruding therefrom and disposing between the bottom grooves; wherein the entire structure of the metallic bottom cover including the plurality of columnar supporting structures is made as a unique piece from the same metal body;

a working space, being formed by engaging the top frame of the metallic top cover and the bottom frame of the metallic bottom cover with the plurality of supporting structures protruding from the inner evaporation surface to contact individually at the inner condensation surface among the plurality of top grooves and providing support to the working space;

a vacuum channel being formed by connecting spatially the upper communicative groove and the lower communicative groove so as to provide a channel for vacuuming the working space;

a plurality of capillary structures, disposed individually inside the plurality of bottom grooves or both the top grooves and the bottom grooves;

a working fluid, being in the working space and the plurality of capillary structures;

wherein, the liquid-cooling cover is engaged with the outer heat-dissipating surface of the metallic top cover with the first heat dissipation pillars accommodating within the first accommodating space to form the liquid-cooling vapor chamber;

the liquid-cooling heat dissipation plate includes:

a heat dissipation bottom plate, comprising a bottom plate inner surface and oppositely a bottom plate outer surface; wherein the bottom plate inner surface comprises:

a plurality of second heat dissipation pillars protruding therefrom arranging in roughly a matrix manner;

at least one flow guide slot protruding therefrom with a long-groove shape disposing between the plurality of second heat dissipation pillars for inserting at least one flow guide having a long-sheet shape;

an outer cover insertion slot being protrudingly provided along the edge of the bottom plate inner surface;

the bottom plate outer surface comprises:

a plurality of fan screw holes protrudingly provided on the bottom plate outer surface for mounting at least one fan to provide forced air-blow to the bottom plate outer surface for cooling;

wherein the entire structure of the heat dissipation bottom plate including the plurality of second heat dissipation pillars, the flow guide slot, the outer cover insertion slot, and the fan screw holes is made as a unique piece from the same metal body by one-piece molding; and a heat dissipation outer cover, including an outer cover top and an outer cover sidewall connecting to the outer cover top; the outer cover sidewall surrounds the outer cover top to form a second accommodation space; the outer cover sidewall is provided with at least one second liquid inlet and at least one second liquid outlet connecting to the second accommodation space;

wherein when the heat dissipation outer cover and the heat dissipation bottom plate are engaged to each other, the outer cover sidewall of the heat dissipation outer cover inserted into the outer cover insertion slot of the heat dissipation bottom plate and then welded, and the plurality of second heat dissipation pillars are disposed in the second accommodation space, to form the liquid-cooling heat dissipation plate;

wherein the first coolant pipeline has one end connected to the first liquid inlet of the liquid-cooling vapor chamber and the other end connected to the second liquid outlet of the liquid-cooling heat dissipation plate, and the second coolant pipeline has one end connected to the first liquid outlet of the liquid-cooling vapor chamber and the other end connected to the second liquid inlet of the liquid-cooling heat dissipation plate; the coolant circulation machine is disposed in between the first coolant pipeline or the second coolant pipeline for pumping and transmission the cooling liquid in order to make the cooling liquid to circulate between the liquid-cooling vapor chamber and the liquid-cooling heat dissipation plate.

2. The liquid-cooling heat dissipation system of claim 1, wherein the outer heat-absorption surface of the metallic bottom cover is a flat surface for contacting the heat-generating electronic element.

3. The liquid-cooling heat dissipation system of claim 1, wherein the outer heat-absorption surface of the metallic bottom cover includes at least one recessed space for accommodating at least one heat-generating electronic element, wherein the recessed space is a concave structure on the outer heat-absorption surface, without a corresponding convex structure on the inner evaporation surface.

4. The liquid-cooling heat dissipation system of claim 3, wherein the outer heat-absorption surface includes thereon a plurality of the recessed spaces for accommodating individually a plurality of heat-generating elements.

5. The liquid-cooling heat dissipation system of claim 4, wherein the plurality of the recessed spaces are having the same or different shapes or volumes for accommodating individually a plurality of the heat-generating elements having corresponding shapes or volumes.

6. The liquid-cooling heat dissipation system of claim 1, wherein the outer heat-absorption surface of the metallic bottom cover has thereon at least one screw hole for mounting at least one heat-generating electronic element; the screw hole has formed correspondingly a screw-hole protrusion by recessing from the outer heat-absorption surface to the inner evaporation surface but not penetrating through; the screw-hole protrusion has a height not higher than the height of the columnar supporting structures.

7. The liquid-cooling heat dissipation system of claim 1, wherein the quantity of the liquid-cooling vapor chamber used is two, three, or four, and the first coolant pipeline and the second coolant pipeline are manifold tubes having branches corresponding to the quantity of liquid-cooling vapor chamber; the coolant circulation machine is a coolant distribution unit (CDU).

8. The liquid-cooling heat dissipation system of claim 1, wherein the liquid-cooling cover, the metallic top cover, the metallic bottom cover, the heat dissipation bottom plate, and the heat dissipation outer cover are made of copper, aluminum, aluminum alloy or magnesium alloy.

9. The liquid-cooling heat dissipation system of claim 1, wherein the working fluid is water.

10. The liquid-cooling heat dissipation system of claim 1, wherein the outer cover sidewall includes a plurality of second liquid inlets and a plurality of second liquid outlets.

11. The liquid-cooling heat dissipation system of claim 10, wherein the quantity of the second liquid inlet and the second liquid outlet are respectively two, three or four.

12. The liquid-cooling heat dissipation system of claim 1, wherein the liquid-cooling heat dissipation plate is a plate-shaped structure with a length of 250 mm-600 mm, a width of 150 mm-450 mm, and a thickness of 10 mm-30 mm.

13. The liquid-cooling heat dissipation system of claim 1, wherein the cooling liquid is water.

14. The liquid-cooling heat dissipation system of claim 1, wherein the cooling liquid is water having a total volume of around 1 liter-6 liters.

* * * * *